United States Patent [19]

Schroeder

[11] 4,282,602
[45] Aug. 4, 1981

[54] CHANNEL SIGNAL DETECTION CIRCUIT FOR SCANNING RECEIVERS

[75] Inventor: Daniel R. Schroeder, Glen Ellyn, Ill.

[73] Assignee: Motorola, Inc., Schaumburg, Ill.

[21] Appl. No.: 59,408

[22] Filed: Jul. 20, 1979

[51] Int. Cl.³ .............................................. H03J 7/18
[52] U.S. Cl. .................................................... 455/169
[58] Field of Search ............... 455/161, 164, 166, 169, 455/308

[56] References Cited

U.S. PATENT DOCUMENTS

| 3,231,686 | 1/1966 | Hueber | 455/308 |
| 3,633,111 | 1/1972 | Smith | 455/161 |

OTHER PUBLICATIONS

Service Manual for Motorola Model #1CH3507, 1974.

*Primary Examiner*—Jin F. Ng
*Attorney, Agent, or Firm*—James S. Pristelski; James W. Gillman

[57] ABSTRACT

An on channel signal detection system for use in scanning receivers to stop scanning at the desired frequency rather than for an undesired frequency. An amplifier receives IF signal and supplies them to a limiter composed of a pair of diodes. The output of the diodes is supplied to a tank circuit having a sufficiently high Q to provide at least some attenuation. The output of the tank circuit causes a transistor to go into conduction to cause a scanning controller to interrupt the scanning mode in the case of a on channel signal only.

5 Claims, 1 Drawing Figure

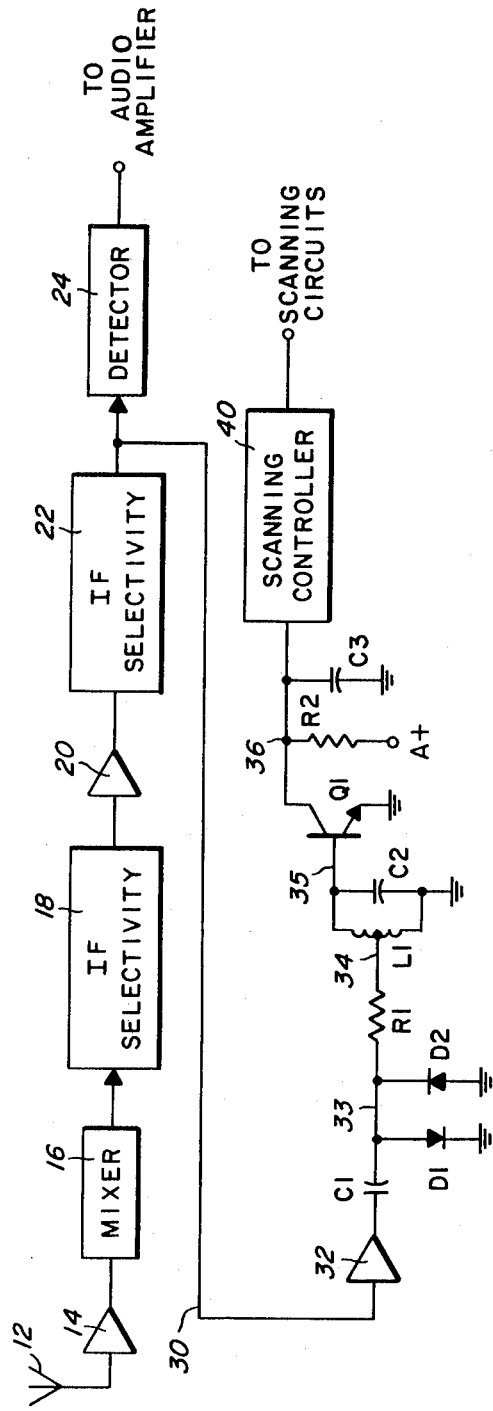

CHANNEL SIGNAL DETECTION CIRCUIT FOR SCANNING RECEIVERS

BRIEF STATEMENT OF INVENTION

The present invention relates to an on channel signal detection system for use in scanning receivers to indicate to the scanning controller that an on channel signal is being received.

BACKGROUND OF THE INVENTION

With the advent of electronic radios which use automatic scanning techniques as described for example in U.S. Pat. No. 4,135,158 to Parmet issued Jan. 16, 1979, there has been created a need for on channel signal detection systems for detecting the broadcast frequency at which the radio should stop scanning. However, in the case of a strong adjacent channel station producing a signal it is possible for the second or adjacent channel station to be picked up by the detection system and the radio to stop scanning at the undesired frequency.

Various techniques are known for providing automatic scan circuits to stop or interupt scanning as described for example in U.S. Pat. No. 3,559,076 to Worcester which describes a circuit for scan prevention during brief signal fades. Also it is known to provide an automatic tuning receiver for a specific television signal or the like which uses a high Q resonant circuit tuned to the particular frequency which produces control pulses within the band pass of the intermediate amplifier as described in U.S. Pat. No. 2,898,400 to Parmet et al. However, none of the known detection systems provide the desired operation of preventing strong adjacent channel stations from causing a desired channel station to be missed in the scanning process as is accomplished by the instant invention.

OBJECT OF THE INVENTION

It is therefore a principle object of the invention to improve on channel signal detection circuits for use with scanning receivers.

It is still another object of the invention is to prevent an electronic radio from stopping prematurely in the presence of a strong signal.

It is the further object of the present invention to enable improved automatic scanning by electronic receivers or the like.

It is a further object of the invention to prevent strong adjacent channel stations from causing a predetermined channel station to be missed during scanning by an electronic radio or the like.

It is still a further object of the present invention to provide a new and improved on channel detection circuit which does not suffer from false stops and skipping stations in the scan mode of operation.

The above objects as well as others will become more apparent upon an understanding of the following specification which should be read in conjunction with the drawing.

DETAILED DESCRIPTION OF THE INVENTION

The on channel signal detection system according to the invention enables receiving an indication from the detection circuit such that the radio will stop scanning during the scan mode of operation. As shown in the figure the radio receiver incorporating the instant invention includes the normally associated components including antenna 12, RF amplifier 14, mixer 16, IF selectively 18, IF amplifier 20 and IF selectively 22 as well as detector 24 which is coupled to the audio amplifier. In accordance with the present invention, the output signals 30 from IF selectivity 22 are supplied to an amplifier 32 to amplify the signal to a level sufficiently high to drive a limiter composed of diodes D1 and D2. The purpose of the limiter diodes D1 and D2 which are coupled to the amplifier through capacitor C1 is to assure a uniform amplitude of the output signal 33. It will be appreciated that diodes D1 and D2 will symmetrically limit signal 33 to a value equal to to twice the threshold value of the diode pair. The output 33 is supplied to a tank circuit comprising L1 and C2 through a resistor R1 which tank circuit is tuned to the desired reference frequency at which scanning is to be stopped. The tank circuit is of sufficiently high Q to provide at least some attenuation for signals at a frequency which are removed by at least one channel spacing away from the tank's center frequency or reference frequency for which scanning is to be stopped. R1 is of sufficiently high resistance to provide isolation between the output of amplifier 32 and the tank circuit input 34. It will be appreciated that resistor R1 serves to prevent the tank circuit from being loaded by the impedances of amplifier 32 and diodes D1 and D2.

In accordance with the invention the voltage at input 34 and thus the voltage at tank output 35 is frequency dependent. Thus, the voltage step-up from 34 to 35 is selected such that an on channel signal will cause a transistor Q1 to go into conduction over some portion of the signal cycle. In the absence of an on channel signal a capacitor C3 is charged to a potential A through a resistor R2. An output signal 36 is produced to enable a scanning controller 40 to continue in the scanning mode. Scanning controller 40 provides signals to scanning circuits of the receiver as is well known by those skilled in the art.

When the desired on channel signal occurs Q1 will conduct and the collector of Q1 will be pulled low. As mentioned a capacitor C3 in conjunction with resistor R2 keep the output of Q1 high between conduction periods. Therefore, if the incoming signal is of sufficient amplitude and is in the center of the tuned tank circuit, Q1 will be triggered and the output 36 to the scanning controller 40 will be a low voltage to cause the scanning controller to interrupt the scanning mode. On the other hand, if the incoming signal produces an IF signal which is one or more channel spacings away from the IF center frequency as determined by the selectivity of the high Q tank circuit the output 35 of the tank circuit will be insufficient to trigger Q1. In this case the output 36 will remain high and the scanning controller will continue to scan.

By the above described invention it will now be appreciated that the detection system cannot be falsed by off channel signals. It will be further appreciated by virtue of the unique design of the detection circuit that the scanning controller can receive only an on channel signal to stop the scanning of the radio and that this is accomplished in a highly reliable manner which does not suffer from false stops or skipping stations. Thus the detection system of the invention is obviously an improvement over the prior art systems and can greatly enhance electronic radio systems or the like which require automatic scan controlling.

I claim:

1. An on channel signal detection system for use in scanning receivers for preventing a strong adjacent channel or station from causing a desired channel or station from being skipped during scanning comprising:

scanning control means for controlling scanning of the receiver over a selected frequency range including a plurality of channels or stations;

amplifying means for receiving IF signals of normally varying amplitude, said amplifying means providing amplification to said variable amplitude IF signals at an output of said amplifying means;

signal limiting means coupled to the output of said amplifying means to produce a constant voltage level output signal in response to said amplified and variable amplitude IF signals when said signals are above a predetermined magnitude;

impedance isolation means coupled to an output of said signal limiting means;

tank circuit means coupled to said impedance isolation means, said tank circuit means having sufficiently high Q to provide attenuation of any signals which vary from a predetermined frequency associated with said tank circuit means, and at which predetermined frequency scanning is to be stopped; and switching means coupled to the output of said tank circuit means and to said scanning control means, the switching means switching state in response to the presence of a voltage at the predetermined frequency from the output of said tank circuit means to deactivate said scanning control means only when the desired channel or station associated with the predetermined frequency is received.

2. A system according to claim 1 wherein said signal limiting means comprises at least one positively biased diode and one negatively biased diode.

3. A system according to claim 2 wherein said impedance isolation means comprises a resistance is connected between said diodes and an inductance coil of said tank circuit means to provide isolation between the impedances thereof whereby the voltages at the input and output of said tank circuit means is dependent on frequency of signals received.

4. A system according to claim 3 wherein said switching means includes a transistor having its base electrode coupled to the voltage output of said tank circuit means.

5. An on channel signal detection system for use in scanning receiver comprising:

scanning control means for controlling scanning of the receiver;

amplifying means for receiving If signals of normally varying amplitude;

signal limiting means coupled to said amplifying means to produce a constant voltage level output signal in response to said variable amplitude IF signals, said signal limiting means comprising at least one positively biased diode and one negatively biased diode;

tank circuit means coupled to said signal limiting means to effect attenuation of signals which vary from a predetermined frequency established by tuning said tank circuit means, a resistance connected between said diode and an inductance coil of said tank circuit means to provide isolation between the impedances thereof whereby the voltages at the input and output of said tank circuit means is dependent upon the frequency of signals received; and switching means coupled to the output of said tank circuit means and to said scanning control means which switch state in response to the output of said tank circuit means to deactivate said scanning control means only when the predetermined frequency is received, said switching means including a transistor having its base electrode coupled to the voltage output of said tank circuit means, said switching means further including a resistor connected between a source of potential and the collector electrode of said transistor and a capacitor connected between said collector electrode and ground to produce control signals to said scanning control means.

* * * * *